(12) United States Patent
Takada et al.

(10) Patent No.: US 9,607,733 B2
(45) Date of Patent: Mar. 28, 2017

(54) DOUBLE-SIDED TRANSPARENT CONDUCTIVE FILM AND TOUCH PANEL

(71) Applicant: NITTO DENKO CORPORATION, Ibaraki-shi, Osaka (JP)

(72) Inventors: Katsunori Takada, Ibaraki (JP); Naoki Hashimoto, Ibaraki (JP); Shinya Hiraoka, Ibaraki (JP); Kazuhiro Ikai, Ibaraki (JP); Hiroki Kuramoto, Ibaraki (JP); Hiroyuki Takao, Ibaraki (JP); Naoki Tsuno, Ibaraki (JP); Toru Umemoto, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/282,474

(22) Filed: May 20, 2014

(65) Prior Publication Data
US 2014/0345917 A1    Nov. 27, 2014

(30) Foreign Application Priority Data

May 22, 2013  (JP) .................................. 2013-107937
Apr. 16, 2014  (JP) .................................. 2014-084361

(51) Int. Cl.
*H01B 5/14*  (2006.01)
*H01B 1/08*  (2006.01)
(Continued)

(52) U.S. Cl.
CPC .......... *H01B 5/002* (2013.01); *G06F 3/0412* (2013.01); *H01B 1/08* (2013.01); *H01B 5/14* (2013.01);
(Continued)

(58) Field of Classification Search
CPC . H01B 5/002; H01B 5/14; H01B 1/08; H05K 1/0274; H05K 1/0298
(Continued)

(56) References Cited

U.S. PATENT DOCUMENTS 6,242,142 B1 * 6/2001 Camp .................... G03C 1/795
430/11
6,693,746 B1 * 2/2004 Nakamura .............. G02B 1/111
359/580

(Continued)

FOREIGN PATENT DOCUMENTS

CN    102214498 A    10/2011
CN    102369108 A    3/2012
(Continued)

OTHER PUBLICATIONS

Office Action dated Jun. 12, 2015, issued in counterpart Taiwanese application No. 103117955, with English translation. (14 pages).
(Continued)

*Primary Examiner* — Timothy Thompson
*Assistant Examiner* — Michael F McAllister
(74) *Attorney, Agent, or Firm* — Westerman, Hattori, Daniels & Adrian, LLP

(57) ABSTRACT

A double-sided transparent conductive film including a base material film, having an anti-blocking layer, an optical adjusting layer and a transparent conductive layer formed in this order on each of both sides of the base material film, wherein an anti-blocking layer containing particles is formed at least one of: a location between the base material film and one optical adjusting layer; and a location between the base material film and the other optical adjusting layer, the anti-blocking layer has a flat portion and protrusion portions caused by the particles, and a value obtained by subtracting a thickness of the flat portion of the anti-
(Continued)

blocking layer from a mode diameter of the particles is larger than a thickness of the optical adjusting layer.

11 Claims, 1 Drawing Sheet

(51) Int. Cl.
    *H01B 5/00*           (2006.01)
    *H05K 1/02*           (2006.01)
    *G06F 3/041*          (2006.01)

(52) U.S. Cl.
    CPC ......... *H05K 1/0274* (2013.01); *H05K 1/0298* (2013.01); *G06F 2203/04103* (2013.01); *Y10T 428/24364* (2015.01)

(58) Field of Classification Search
    USPC .......................................... 428/212; 174/255
    See application file for complete search history.

(56) References Cited

U.S. PATENT DOCUMENTS

| | | | | |
|---|---|---|---|---|
| 8,313,201 | B2* | 11/2012 | Wakizaka | G02B 1/111 |
| | | | | 359/599 |
| 8,531,406 | B2* | 9/2013 | Nashiki | G06F 3/045 |
| | | | | 200/512 |
| 2003/0008135 | A1* | 1/2003 | Kawamura | G02F 1/13439 |
| | | | | 428/336 |
| 2004/0219338 | A1* | 11/2004 | Hebrink | B32B 27/08 |
| | | | | 428/202 |
| 2006/0159888 | A1* | 7/2006 | Hebrink | B32B 3/30 |
| | | | | 428/141 |
| 2007/0121211 | A1* | 5/2007 | Watanabe | G02B 1/11 |
| | | | | 359/601 |
| 2007/0146887 | A1* | 6/2007 | Ikeda | G02B 1/111 |
| | | | | 359/586 |
| 2007/0237966 | A1 | 10/2007 | Takao et al. | |
| 2007/0242362 | A1 | 10/2007 | Takada et al. | |
| 2007/0291367 | A1 | 12/2007 | Hamamoto et al. | |
| 2008/0013179 | A1* | 1/2008 | Kobayashi | G02B 1/115 |
| | | | | 359/587 |
| 2009/0284475 | A1 | 11/2009 | Nashiki et al. | |
| 2010/0013784 | A1* | 1/2010 | Nashiki | C23C 14/08 |
| | | | | 345/173 |
| 2010/0102027 | A1* | 4/2010 | Liu | G06F 3/044 |
| | | | | 216/13 |
| 2011/0151215 | A1* | 6/2011 | Kobayashi | B32B 7/02 |
| | | | | 428/212 |
| 2012/0147472 | A1 | 6/2012 | Kajiya et al. | |
| 2012/0160560 | A1 | 6/2012 | Kajiya et al. | |
| 2012/0237729 | A1* | 9/2012 | Ozawa | C08J 7/045 |
| | | | | 428/147 |
| 2013/0003181 | A1 | 1/2013 | Hayashibe et al. | |
| 2013/0113757 | A1 | 5/2013 | Tanaka et al. | |
| 2013/0157010 | A1* | 6/2013 | Takada | H05K 1/0298 |
| | | | | 428/147 |
| 2013/0169593 | A1 | 7/2013 | Imamura et al. | |
| 2013/0194221 | A1 | 8/2013 | Takada et al. | |
| 2013/0241689 | A1 | 9/2013 | Nakajima et al. | |
| 2014/0048401 | A1 | 2/2014 | Kobayashi | |

FOREIGN PATENT DOCUMENTS

| | | |
|---|---|---|
| CN | 102804110 A | 11/2012 |
| CN | 103097995 A | 5/2013 |
| JP | 2012-020425 A | 2/2012 |
| KR | 1020110059663 A | 6/2011 |
| TW | 200723312 A | 9/1995 |
| TW | 200745229 A | 3/1996 |
| TW | 200807014 A | 6/1996 |
| TW | 201221362 A1 | 6/2012 |
| TW | 201232569 A1 | 8/2012 |
| TW | 201250722 A1 | 12/2012 |
| WO | 2011/065032 A1 | 6/2011 |

OTHER PUBLICATIONS

Extended European Search Report dated Sep. 26, 2014, issued in corresponding European Patent Application No. 14169260.8 (6 pages).
Korean Office Action dated Sep. 18, 2015 issued in counterpart Korean patent application No. 10-2014-0061214. (10 pages).
Office Action dated Nov. 16, 2015, issued in counterpart Chinese Patent Application No. 201410216363.9, with English translation. (17 pages).
Office Action dated Mar. 31, 2016, issued in counterpart Korean Patent Application No. 10-2014-0061214, with English translation. (8 pages).
Office Action dated Jul. 25, 2016, issued in counterpart Chinese Application No. 201410216363.9, with English translation. (19 pages).

* cited by examiner

DOUBLE-SIDED TRANSPARENT CONDUCTIVE FILM AND TOUCH PANEL

BACKGROUND OF THE INVENTION

Field of the Invention

The present invention relates to a double-sided transparent conductive film, and a touch panel.

Description of the Related Art

In recent years, projected-capacitive touch panels or matrix-type resistive touch panels can attain multi-point input (multi-touch) to be excellent in operability. Demands therefor have been rapidly increasing. As an electrode member of such a touch panel, a double-sided transparent conductive film is suggested, in which transparent conductive thin films are formed on both sides of a transparent film base material, respectively.

A touch panel as described above makes use of a double-sided transparent conductive film having patterned transparent conductive layers. As the material of the transparent conductive layers, indium/tin composite oxide (ITO) is widely used from the viewpoint of the visible ray transmittance thereof. However, the refractive index of ITO is high. Thus, when a transparent conductive layer containing ITO is patterned, a difference is generated in pattern-visibility between its part in which the transparent conductive layer constitutes the pattern (pattern-formed part) and its part in which the transparent conductive layer is removed (pattern opening part). Accordingly, when the pattern is observed from the outside, the touch panel may be deteriorated in appearance or a hue (color tone) may be generated. In order to make such a pattern inconspicuous, in a double-sided transparent conductive film having, on its both sides, transparent conductive layers, respectively, suggested is a technique of providing an optical adjusting layer between the film base material and the transparent conductive layer (WO 2011/065032).

SUMMARY OF THE INVENTION

In the above-mentioned technique, for the formation of the optical adjusting layer, a drying process such as sputtering is adopted, but it is desired to use a wet coating process since this process makes it possible to attain continuous production in a roll-to-roll manner to decrease costs. However, in the roll-to-roll manner, films superimposed onto each other may adhere closely to each other and may become hard to be peeled from each other (the so-called blocking). In some cases, the films may be broken or scratched to be declined in productivity.

In order to restrain blocking against such a problem, a countermeasure can be adopted which includes the formation of an anti-blocking layer having a surface in which irregularities are formed. However, when an optical adjusting layer is formed onto the anti-blocking layer through a wet coating process, the protrusion portions of the anti-blocking layer are lost by a liquid for the coating so that this layer does not exhibit anti-blocking property. Thus, blocking may be generated.

In light of the above, an object of the present invention is to provide a double-sided transparent conductive film which is good in appearance even when its transparent conductive layers are patterned, and has anti-blocking property, thereby being producible at low costs; a wound body thereof; and a touch panel.

In order to solve the problems, the inventors have made eager investigations to find out that the object can be attained by setting the particle diameter of particles in an anti-blocking layer and the thickness of an optical adjusting layer to satisfy a specific relationship.

Accordingly, the present invention relates to a double-sided transparent conductive film, including a base material film, and a base material film, and an optical adjusting layer and a transparent conductive layer which are formed in this order on both each of sides of the base material film, wherein an anti-blocking layer containing particles is formed at least one of:

a location between the base material film and one optical adjusting layer; and a location between the base material film and the other optical adjusting layer, the anti-blocking layer has a flat portion and protrusion portions caused by the particles, and a value obtained by subtracting a thickness of the flat portion of the anti-blocking layer from a mode diameter of the particles is larger than a thickness of the optical adjusting layer.

In this double-sided transparent conductive film, the optical adjusting layers are provided between the base material film and the individual transparent conductive layers in such a manner that an optical design can be attained in a relationship between the optical adjusting layers and the transparent conductive layers formed in the respective both sides of the base material film. Thus, even when the transparent conductive layers are patterned, the pattern can be made inconspicuous and the generation of a hue can be restrained so that the double-sided transparent conductive film can attain a good appearance. Moreover, the value obtained by subtracting the thickness of the flat portion of the anti-blocking layer from the mode diameter of the particles is made larger than the thickness of the optical adjusting layer; thus, even when the optical adjusting layer is formed by wet coating, the protrusion portions of the anti-blocking layer are not lost. In other words, protrusions are present also in the optical adjusting layer, the protrusions being caused by the protrusion portions of the underlying anti-blocking layer. As a result, the double-sided transparent conductive film can exhibit excellent anti-blocking property. Furthermore, this film can maintain the anti-blocking property even when the optical adjusting layer is formed by wet coating. Accordingly, the production of the double-sided transparent conductive film, which includes the formation of the optical adjusting layer, can be continuously attained in a roll-to-roll manner so that this film can be produced at low costs.

It is preferred that the optical adjusting layers each have a thickness of 50 nm to 300 nm. This makes it possible that even when the transparent conductive layers are patterned, the pattern is made inconspicuous to make the double-sided transparent conductive film good in appearance.

The optical adjusting layers are each preferably a layer formed by wet coating. This makes it possible to form the optical adjusting layers in a roll-to-roll manner to reduce costs for the production.

The value obtained by subtracting the thickness of the flat portion of the anti-blocking layer from a height of the protrusion portion of the anti-blocking layer is preferably larger than the thickness of the optical adjusting layer. The adoption of this structure makes it possible to prevent the protrusion portions of the anti-blocking layer from being lost when this optical adjusting layer is formed by wet coating. Thus, the double-sided transparent conductive film can exhibit anti-blocking property required when produced in a roll-to-roll manner.

The double-sided transparent conductive film preferably has a haze of 5% or less. In this case, the film can exhibit high transparency to ensure good visibility.

Each of the transparent conductive layers is preferably patterned. The double-sided transparent conductive film preferably has a pattern-formed part where the transparent conductive layer forms a pattern, and a pattern opening part where the transparent conductive layer is removed. By patterning the transparent conductive layer specifically, the present film can be preferably applied, in particular, to a capacitive touch panel.

It is preferred that when the transparent conductive layers of the double-sided transparent conductive film are patterned, and the patterned transparent conductive layers are seen through in planar view, an absolute value of a difference in reflectance between the following regions is 1% or less: a double-sided patterned region where the pattern-formed parts on both sides overlap with each other; and a single-side patterned region having the pattern-formed part on one surface and the pattern opening part on the other surface. This makes it possible to restrain the present film from undergoing pattern-observation affected by the visibility difference based on the presence or absence of the pattern. Thus, the double-sided transparent conductive film can be obtained to have a better appearance.

The double-sided patterned region preferably has a reflected hue b* satisfying the following: −10≤b*≤0. This makes it possible to restrain effectively the generation of any hue (particularly, a yellowish tone) of the double-sided transparent conductive film.

The base material film preferably includes a cycloolefin-based resin. This makes it possible to heighten the double-sided transparent conductive film further in transparency so that this film can attain a good appearance.

The present invention also relates to a double-sided transparent conductive film wound body including a long body of the double-sided transparent conductive film wound in a roll form.

The present invention is further directed to a touch panel including the double-sided transparent conductive film.

DETAILED DESCRIPTION OF THE PREFERRED EMBODIMENTS

An embodiment of the present invention will be described below with reference to the drawings. The form illustrated in each of the drawings is not an actual ratio, and is illustrated in a partially enlarged or reduced scale for the convenience of the description. In the present specification, the terms each denoting a positional relationship, such as the terms "upper", "lower", "right", "left", "front" and "rear", are terms merely for making the description easy, and each never have an intention of specifying the positional relationship of actual and specific structural elements.

<Double-Sided Transparent Conductive Film>

Figure 1:
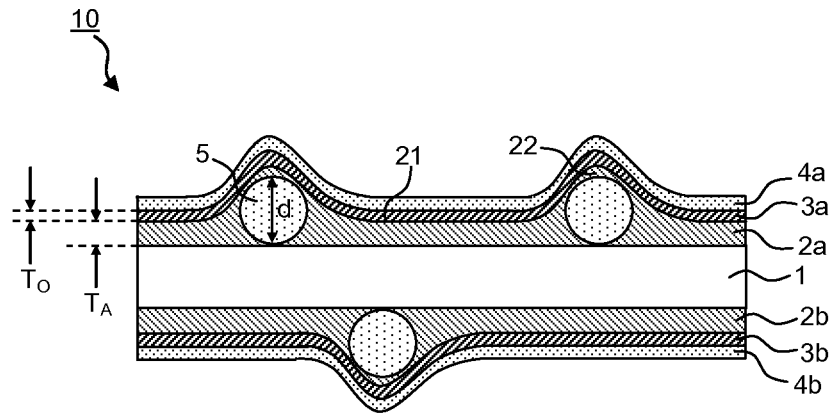
FIG. 1 is a schematic sectional view of a double-sided transparent conductive film according to an embodiment of the present invention.

FIG. 1 is a sectional view which schematically illustrates an embodiment of the double-sided transparent conductive film according to the present invention. In a double-sided transparent conductive film 10, on both sides of a base material film 1 are successively formed the following respective layers: anti-blocking layers 2a and 2b (hereinafter both layers are collectively referred to also as the anti-blocking layer 2) each containing particles 5; optical adjusting layers 3a and 3b (hereinafter both layers are collectively referred to also as the optical adjusting layer 3); and transparent conductive layers 4a and 4b (hereinafter both layers are collectively referred also as the transparent conductive layer 4). In FIG. 1, the anti-blocking layers 2a and 2b are formed on the both sides of the base material film 1. However, an anti-blocking layer may be formed on only one of the upper surface and the lower surface of the base material film 1. Regarding each of the anti-blocking layer 2, the optical adjusting layer 3, and the transparent conductive layer 4, the structure thereof at one side of the base material film 1 may be identical with that at the other side; thus, hereinafter, a description will be mainly made regarding the structure at the upper surface side of the base material film 1 in FIG. 1.

The anti-blocking layer 2a has, on a surface thereof, a flat portion 21 and protrusion portions 22. The formation of the protrusion portions 22 is caused by respective particles 5. In the double-sided transparent conductive film 10, the value obtained by subtracting the thickness $T_A$ of the flat portion 21 of the anti-blocking layer 2a from the mode diameter d of the particles 5 is larger than the thickness $T_o$ of the optical adjusting layer 3a. When the optical adjusting layer 3a is formed by wet coating, the flat portion 21 of the anti-blocking layer 2a is buried by the optical adjusting layer 3a so that the height of the protrusion portion 22 is relatively decreased. Thus, the anti-blocking layer 2a may lose blocking resistance. The double-sided transparent conductive film 10 is formed in such a manner that the mode diameter d of the particles 5, the thickness $T_A$ of the flat portion 21 and the thickness $T_o$ of the optical adjusting layer 3a satisfy the specific relationship. Thus, even when the optical adjusting layer 3a is formed by wet coating, the protrusion portions 22 of the anti-blocking layer 2a can be prevented from being lost. As a result, the protrusion portions 22 can cause the generation of protrusions also in the surface of the optical adjusting layer 3a, so that the double-sided transparent conductive film can exhibit good anti-blocking property. In FIG. 1, the particles 5 having the mode diameter d have been illustrated. However, the anti-blocking layer 2a may contain particles 5 having a particle diameter other than the mode diameter d as far as the advantageous effects of the present invention are not damaged.

In the double-sided transparent conductive film 10, usually, the thickness of the anti-blocking layer 2a is set into the order of micrometers while the thickness of each of the optical adjusting layer 3a and the transparent conductive layer 4a is set into the order of nanometers, which is a very small thickness. Thus, the transparent conductive layer 4a as the outermost surface layer follows the protrusions of the optical adjusting layer 3a to have protrusions. This is the same as in the lower surface side of the base material film 1 in FIG. 1.

The haze of the double-sided transparent conductive film is not particularly limited as far as the film can ensure required transparency. The haze is preferably 5% or less, more preferably 4% or less, even more preferably 3% or less. The lower limit of the haze is preferably 0%. In many cases, however, the haze is generally 0.3% or more by the presence of the protrusions in the outermost surface layers, and so on.

<Base Material Film>

The base material film 1 is not particularly limited, and various kinds of plastic films having transparency are used. Examples of the material thereof include a polyester-based resin, an acetate-based resin, a polyether sulfone-based resin, a polycarbonate-based resin, a polyamide-based resin, a polyimide-based resin, a polyolefin-based resin, a polycycloolefin-based resin such as a polynorbonene-based resin, a (meth)acryl-based resin, a polyvinyl chloride-based resin, a polyvinylidene chloride-based resin, a polystyrene-based resin, a polyvinyl alcohol-based resin, a polyarylate-based resin and a polyphenylene sulfide-based resin. Among them preferable are a polycycloolefin-based resin, a polyester-based resin, a polycarbonate-based resin and a polyolefin-based resin. A polycycloolefin-based resin is especially preferable.

The thickness of the base material film 1 is preferably in a range of 2 to 200 µm, more preferably in a range of 20 to 180 µm. If the thickness of the base material film 1 is less than 2 µm, the mechanical strength of the base material film 1 may become insufficient, thus making it difficult to perform an operation to continuously form the optical adjusting layer 3 and the transparent conductive layer 4 with the film base material formed in a roll shape. On the other hand, if the thickness is more than 200 µm, the scratch resistance of the transparent conductive layer 4 and dotting property as intended for use in a touch panel may not be improved.

The surface of the base material film 1 may be subjected beforehand to an etching treatment or a undercoating treatment such as sputtering, plasma treatment, corona discharge, flame, ultraviolet-ray irradiation, electron-beam irradiation, chemical conversion or oxidation to improve adhesion with an anti-blocking layer, an optical adjusting layer and the like which are formed on the film base material. The surface of the film base may be freed from dust and cleaned by solvent cleaning or ultrasonic cleaning as necessary before the anti-blocking layer and the optical adjusting layer are formed.

<Anti-Blocking Layer>

As described above, the anti-blocking layer 2 has, on the surface, the flat portion 21 and the protrusion portions 22. The formation of the protrusion portions 22 is caused by the particles 5 contained in the anti-blocking layer 2. The height of the protrusion portion 22 is preferably larger than the thickness $T_o$ of the optical adjusting layer 3. Specifically, taking the flat portion 21 as the basis, the height is preferably 100 nm or more and 3 µm or less, more preferably 200 nm or more and 2 µm or less, even more preferably 300 nm or more and 1.5 µm or less. When the height of the protrusion portion 22 is set into the range, predetermined protrusion portions can be given to each of the outermost surface layers (the transparent conductive layer 4 in FIG. 1) so that the double-sided transparent conductive film 10 can satisfy anti-blocking property, and can be sufficiently decreased in glaringness and sufficiently restrained from rising in haze.

The thickness of the flat portion 21 of the anti-blocking layer 2 is not particularly limited, and is preferably 200 nm or more and 30 µm or less, more preferably 500 nm or more and 10 µm or less, even more preferably 800 nm or more and 5 µm or less. If the thickness of the flat portion of the anti-blocking layer is too small, the precipitation of low-molecular-weight components, such as oligomers, from the base material film cannot be restrained so that the double-sided transparent conductive film or a touch panel using this film tends to be deteriorated in visibility. Contrarily, if the thickness of the flat portion of the anti-blocking layer is too large, the double-sided transparent conductive film tends to be curled with the surface on which the anti-blocking layer is formed being inward by heating when the transparent conductive layers are crystallized or a touch panel is fabricated. Thus, if the thickness of the flat portion of the anti-blocking layer is large, this film tends to be deteriorated in handleability by a problem apart from the anti-blocking property and slidability. In the present specification, the thickness of the flat portion of the anti-blocking layer denotes the average thickness of the flat portion of the anti-blocking layer.

The mode diameter of particles can be appropriately set in consideration of the size of the protrusion portion of the outermost surface layer, the thickness of the flat portion 21 of the anti-blocking layer 2 and so on, and is not particularly limited. From the viewpoint of sufficiently imparting blocking resistance to the double-sided transparent conductive film and sufficiently suppressing an increase in haze, the mode diameter of particles is preferably 500 nm or more and 30 µm or less, more preferably 800 nm or more and 20 µm or less, more preferably 1 µm or more and 10 µm or less. The "mode diameter" as used herein refers to a particle diameter showing a maximum value in the particle distribution, and can be determined by making a measurement under predetermined conditions (Sheath liquid: ethyl acetate, measurement mode: HPF measurement, measurement method: total count) using a flow-type particle image analyzer (manufactured by Sysmex Corporation, trade name "FPIA-3000S"). Particles are diluted to 1.0% by weight with ethyl acetate, and uniformly dispersed using an ultrasonic cleaning machine, and the dispersion thus obtained is used as a measurement sample.

Particles may be either polydisperse particles or monodisperse particles, but monodisperse particles are preferred when ease of giving a protrusion portion and antiglare performance are considered. In the case of monodisperse particles, the particle diameter of particles and the mode diameter can be considered substantially identical.

The content of particles in the anti-blocking layer is preferably 0.01 to 5 parts by weight, more preferably 0.02 to 1 parts by weight, further preferably 0.05 to 0.5 parts by weight based on 100 parts by weight of solid content of the resin composition. If the content of particles in the anti-blocking layer is low, a protrusion portion sufficient to impart blocking resistance to the surface of the anti-blocking layer may become hard to be formed. On the other hand, if the content of particles is excessively high, the haze of the double-sided transparent conductive film may be increased due to light scattering by particles to deteriorate visibility. Further, if the content of particles is excessively high, streaks may occur during formation of the anti-blocking layer (during application of a solution), leading to deterioration of visibility and nonuniformity in electrical property of the transparent conductive layer.

(Resin Composition)

As a resin composition that forms the anti-blocking layer 2, one which is capable of dispersing particles, has a sufficient strength as a film after formation of the anti-blocking layer and has transparency can be used without particular limitation. Examples of the resin to be used include a thermosetting resin, a thermoplastic resin, an ultraviolet-ray curing-type resin, an electron-beam curing-type resin and a two-component mixing type resin, and among them, an ultraviolet-ray curing-type resin is preferred with which a film can be formed efficiently by a simple processing operation of a curing treatment by ultraviolet-ray irradiation.

Examples of the ultraviolet-ray curing-type resin include various kinds such as polyester-based, acryl-based, urethane-based, amide-based, silicone-based and epoxy-based ultraviolet-ray curing-type resins, which include ultraviolet-ray curing-type monomers, oligomers and polymers. Examples of the ultraviolet-ray curing-type resin that is preferably used include those having an ultraviolet-ray polymerizable functional group, particularly those containing an acryl-based monomer or oligomer component having 2 or more, particularly 3 to 6 such functional groups. Further, the ultraviolet-ray curing-type resin contains an ultraviolet-ray polymerization initiator.

For the resin layer forming material, additives such as a leveling agent, a thixotropy agent and an antistatic agent can be used in addition to the aforementioned materials. Use of a thixotropy agent is advantageous for formation of protruding particles in a fine unevenness-shaped surface. Examples of the thixotropy agent include silica and mica, each of which has a size of 0.1 μm or less. It is preferred that the content of these additives is normally about 15 parts or less by weight, preferably 0.01 to 15 parts by weight based on 100 parts by weight of the ultraviolet-ray curing-type resin.
(Particles)

For particles that are contained in the anti-blocking layer 2, those having transparency, such as various kinds of metal oxides, glass and plastic, can be used without particular limitation. Examples thereof include inorganic particles such as silica, alumina, titanium, zirconia and calcium oxide, crosslinked or uncrosslinked organic particles formed of various kinds of polymers such as polymethyl methacrylate, polystyrene, polyurethane, acryl-based resins, acryl-styrene copolymers, benzoguanamine, melamine and polycarbonate, and silicone-based particles. One kind or two or more kinds of particles can be appropriately selected from the aforementioned particles, and used, but organic particles are preferred. As organic particles, acryl-based resins are preferred in terms of a refractive index.
(Coating Composition)

A coating composition that is used for forming the anti-blocking layer includes the above-described resin, particles and solvent. To the coating composition can be added various additives as necessary. Examples of these additives include usual additives such as an antistatic agent, a plasticizer, a surfactant, an antioxidant and an ultraviolet-ray absorber.

The coating composition is prepared by mixing the above-described resin and particles with a solvent, additives, a catalyst and so on as necessary. The solvent in the coating composition is not particularly limited, and is appropriately selected in consideration of a resin used, a material of a portion as a coating ground and a method for applying the composition. Specific examples of the solvent include aromatic solvents such as toluene and xylene; ketone-based solvents such as methyl ethyl ketone, acetone, methyl isobutyl ketone and cyclohexanone; ether-based solvents such as diethyl ether, isopropyl ether, tetrahydrofuran, dioxane, ethylene glycol dimethyl ether, ethylene glycol diethyl ether, diethyleneglycol dimethyl ether, diethylene glycol diethyl ether, propylene glycol monomethyl ether, anisole and phenetole; ester-based solvents such as ethyl acetate, butyl acetate, isopropyl acetate and ethylene glycol diacetate; amide-based solvents such as dimethyl formamide, diethyl formamide and N-methylpyrrolidone; cellosolve-based solvents such as methyl cellosolve, ethyl cellosolve and butyl cellosolve; alcohol-based solvents such as methanol, ethanol and propanol; and halogen-based solvents such as dichloromethane and chloroform. These solvents may be used alone, or used in combination two or more thereof. Among these solvents, ester-base solvents, ether-based solvents, alcohol-based solvents and ketone-based solvents are preferably used.

In the coating composition, preferably particles are dispersed in a solution. As a method for dispersing particles in a solution, various known methods can be employed such as a method in which particles are added to a resin composition solution, and the mixture is mixed, and a method in which particles dispersed in a solvent beforehand are added to a resin composition solution.

The solid concentration of the coating composition is preferably 1% by weight to 70% by weight, more preferably 2% by weight to 50% by weight, most preferably 5% by weight to 40% by weight. If the solid concentration is excessively low, variations in the protrusion portion of the surface of the anti-blocking layer increase during a drying step after application, and the haze of an area of the surface of the anti-blocking layer, where the protrusion portion becomes larger, may be increased. On the other hand, if the solid concentration is excessively high, contained components tend to aggregate, and as a result, the aggregation areas may become apparent to deteriorate the appearance of the double-sided transparent conductive film.
(Application and Curing)

The anti-blocking layer is formed by applying the coating composition onto a base material. Application of the coating composition onto the base material film 1 is conducted for both surfaces of the base material in this embodiment. The coating composition may be applied directly onto the base material film 1, or may be applied onto an undercoat layer or the like formed on the base material film 1.

A method for applying the coating composition can be appropriately selected according to a coating composition and a situation of an application step, and application can be performed using, for example, a dip coating method, an air knife method, a curtain coating method, a roller coating method, a wire bar coating method, a gravure coating method, a die coating method or an extrusion coating method.

The anti-blocking layer can be formed by curing the coating film after applying the coating composition. When the resin composition is photocurable, it is possible to cure by irradiating with light using a light source which emits light having a wavelength as needed. As light to irradiate the resin composition, for example, light with an exposure amount of 150 mJ/cm$^2$ or more, preferably light with an exposure amount of 200 mJ/cm$^2$ to 1000 mJ/cm$^2$ can be used. The wavelength of the irradiation light is not particularly limited, and for example, irradiation light having a wavelength of 380 nm or less can be used. Heating may be performed at the time of the photocuring treatment or after the photocuring treatment.

The surface of the anti-blocking layer 2 may be subjected beforehand to an etching treatment or a undercoating treatment such as sputtering, plasma treatment, corona discharge, flame, ultraviolet-ray irradiation, electron-beam irradiation, chemical conversion or oxidation to improve adhesion with an optical adjusting layer and the like which are formed on the anti-blocking layer. The surface of the anti-blocking layer may be freed from dust and cleaned by solvent cleaning or ultrasonic cleaning as necessary before the optical adjusting layer is formed.

<Optical Adjusting Layer>

In the double-sided transparent conductive film 10 of this embodiment, the optical adjusting layer 3 is provided between the anti-blocking layer 2 and the transparent conductive layer 4 for the purpose of controlling adhesion and reflection property of the transparent conductive layer, and so on. The optical adjusting layer may be a single layer, or two or more layers may be provided. The optical adjusting layer is formed of an inorganic substance, an organic substance or a mixture of an inorganic substance and an organic substance. Examples of the material that forms the optical adjusting layer include inorganic substances such as NaF, $Na_3AlF_6$, LiF, $MgF_2$, $CaF_2$, $SiO_2$, $LaF_3$, $CeF_3$, $Al_2O_3$, $TiO_2$, $Ta_2O_5$, $ZrO_2$, ZnO, ZnS and $SiO_x$ (x is 1.5 or more and less than 2), and organic substances such as an acryl resin, an urethane resin, a melamine resin, an alkyd resin and a siloxane-based polymer. As the organic substance, in particular, it is preferred to use a thermosetting resin formed of a mixture of a melamine resin, an alkyd resin and an organic silane condensate. The optical adjusting layer can be formed by a wet coating method such as a gravure coating method or a bar coating method using the material described above. In this way, at least one optical adjusting layer is preferably formed by a wet coating method. However, when two or more layers of the optical adjusting layers are formed, the optical adjusting layer may be formed by a vacuum deposition method, a sputtering method and an ion plating method, and the like as well as the above mentioned wet coating method.

The thickness of the optical adjusting layer 3 may be appropriately set in consideration of the difference in reflectance between the pattern-formed part and the pattern opening part, the hue of the film, and others. The thickness of the optical adjusting layer 3 ranges preferably from 50 nm to 300 nm. When the refractive index of the optical adjusting layer is particularly 1.58 or more and 1.64 or less, the thickness of the optical adjusting layer is preferably 50 nm or more and 150 nm or less. When the refractive index of the optical adjusting layer is 1.65 or more and 1.7 or less, the thickness of the optical adjusting layer is preferably 80 nm or more and 300 nm or less. When the optical adjusting layer is formed into a two layer-form, the thickness of a first optical adjusting layer at the base material film side is preferably from 10 nm to 60 nm. The thickness of a second optical adjusting layer at the transparent conductive layer (ITO-film) side is preferably from 10 nm to 60 nm. When the optical adjusting layer is formed into the two layer-form, the refractive index of the first optical adjusting layer and that of the second optical adjusting layer are preferably from 1.6 to 1.8 and from 1.3 to 1.6, respectively. The reflectance difference between the pattern-formed part and the pattern opening part or the hue of the double-sided transparent conductive film can be more effectively restrained by considering the refractive index of the optical adjusting layer well as the thickness thereof. When the optical adjusting layer is formed into such a thickness at a level of nanometers, the surface of the optical adjusting layer in the transparent conductive layer 4 side substantially maintains the protrusion form of the surface of the anti-blocking layer 2, which is an underlying layer underneath the optical adjusting layer. The protrusion form is maintained also in the surface of the transparent conductive layer 4, so that the double-sided transparent conductive film can be formed to have anti-blocking property.

The optical adjusting layer may have nano-fine particles having an average particle diameter of 1 nm to 500 nm. The content of nano-fine particles in the optical adjusting layer is preferably 0.1% by weight to 90% by weight. The average particle diameter of nano-fine particles that are used for the optical adjusting layer is preferably 1 nm to 500 nm as described above, more preferably 5 nm to 100 nm. The content of nano-fine particles in the optical adjusting layer is more preferably 10% by weight to 80% by weight, further preferably 20% by weight to 70% by weight. By including nano-fine particles in the optical adjusting layer, the refractive index of the optical adjusting layer itself can be easily adjusted.

Examples of the inorganic oxide that forms nano-fine particles include fine particles of silicon oxide (silica), hollow nano-silica, titanium oxide, aluminum oxide, zinc oxide, tin oxide, zirconium oxide and the like. Among them, fine particles of silicon oxide (silica), titanium oxide, aluminum oxide, zinc oxide, tin oxide and zirconium oxide are preferred. They may be used alone, or used in combination of two or more thereof.

<Transparent Conductive Layer>

The constituent material of the transparent conductive layer 4 is not particularly limited, and a metal oxide of at least one metal selected from the group consisting of indium, tin, zinc, gallium, antimony, titanium, silicon, zirconium, magnesium, aluminum, gold, silver, copper, palladium and tungsten is suitably used. The metal oxide may further contain metal atoms shown in the above-mentioned group as necessary. For example, indium oxide containing tin oxide (ITO), tin oxide containing antimony (ATO), and the like are preferably used.

The thickness of the transparent conductive layer 4 is not particularly limited, but is preferably 10 nm or more for forming a continuous film having such a good conductivity that its surface resistance is no higher than $1 \times 10^3 \Omega/\square$. If the thickness is excessively large, the transparency is deteriorated, and therefore the thickness is preferably 15 to 35 nm, more preferably in a range of 20 to 30 nm. If the thickness of the transparent conductive layer 4 is less than 15 nm, the electric resistance of the film surface increases, and a continuous film is hard to be formed. If the thickness of the transparent conductive layer 4 is more than 35 nm, deterioration of transparency or the like may be caused.

When the transparent conductive layer 4 is patterned, the refractive index of the transparent conductive layer 4 is preferably from about 1.85 to 2.1 in order to restrain a difference in reflectance between pattern-formed parts P and an pattern opening part O (see FIG. 2) and further restrain a difference in hue therebetween.

The method for forming the transparent conductive layer 4 is not particularly limited, and a previously known method can be employed. Specifically, for example, dry processes such as a vacuum deposition method, a sputtering method and an ion plating method can be shown as an example. An appropriate method can also be employed according to a required thickness. When the transparent conductive layer 4 is formed through a dry process such as a sputtering process, as illustrated in FIG. 1, the surface of the transparent conductive layer 4 substantially maintains the respective forms of the flat portion and the protrusion portions of the surface of the anti-blocking layer 2a, which is an underlying layer underneath the transparent conductive layer 4, (and the optical adjusting layer 3). Accordingly, even when the optical adjusting layer 3 and the transparent conductive layer 4 are formed on the anti-blocking layer 2, anti-blocking property can be favorably imparted to the surface of the transparent conductive layer 4.

The transparent conductive layer 4 can be crystallized by being subjected to a heating annealing treatment (for example, under an air atmosphere at 80 to 150° C. for about 30 to 90 minutes) as necessary. When the transparent conductive layer is crystallized, the resistance of the transparent conductive layer is reduced, and also transparency and durability are improved. By ensuring that the thickness the anti-blocking layer 2a falls within the above-described range in the double-sided transparent conductive film 10, occurrence of curl is suppressed at the time of heating annealing treatment, leading to excellent handling property.

Figure 2:
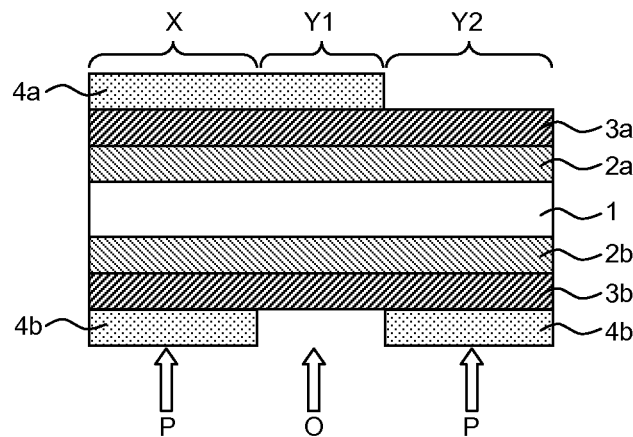
FIG. 2 is a schematic sectional view of the double-sided transparent conductive film according to another embodiment of the invention.
Figure 3:
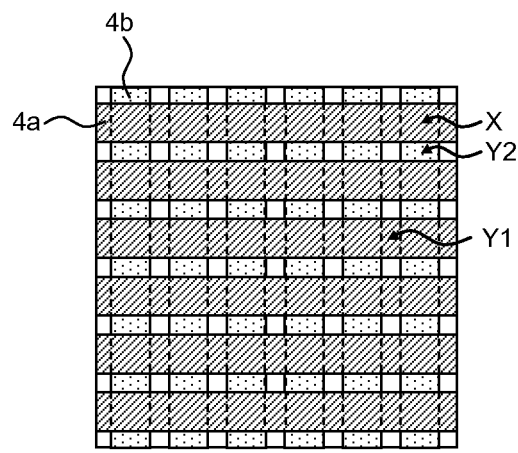
FIG. 3 is a partially transparent plan view which schematically illustrates an example of a pattern of a transparent conductive layer.

As illustrated in each of FIGS. 2 and 3, the transparent conductive layer 4 may be patterned by etching or the like. FIG. 2 illustrates a double-sided transparent conductive film 10 in which a transparent conductive layer 4 is patterned. For the convenience of a description, however, in FIG. 2, particles contained in an anti-blocking layer 2 and protrusion portions caused by the particles are omitted, and the thicknesses of the respective layers are different from those in the embodiment illustrated in FIG. 1. The double-sided transparent conductive film illustrated in FIG. 2 has pattern-formed parts P in which the transparent conductive layer 4 forms a pattern, and a pattern opening part O in which the transparent conductive layer 4 is removed. As illustrated in FIG. 3, in a double-sided transparent conductive film used in a capacitive touch panel or matrix-type resistive touch panel, it is preferred that the transparent conductive layers 4a and 4b are patterned into the form of stripes, and it is preferred that the transparent conductive layers 4a and 4b lie at right angles to each other to form a lattice-form matrix pattern. In FIG. 3, the width of the pattern-formed part P is illustrated to be larger than that of the pattern opening part O. However, in the present invention, these are not limited into this form.

When the transparent conductive layers 4a and 4b of the double-sided transparent conductive film 10 are patterned as illustrated in each of FIGS. 2 and 3, the following may be preset in accordance with the form of the pattern upon seeing through the double-sided transparent conductive film in planar view: double-sided patterned regions X where the pattern-formed parts of the both sides overlap with each other; and single-side patterned regions Y (Y1 and Y2) having the pattern-formed parts on one side and the pattern opening part on the other side. In this case, the absolute value of the difference ΔR in reflectance between the double-sided patterned regions X and the single-side patterned regions Y is preferably 1% or less, more preferably 0.5% or less. Additionally, the reflected hue b* of the double-sided patterned regions x preferably satisfies −10≤b*≤0; more preferably, −8≤b*≤0; and even more preferably, −5≤b*≤0. When the absolute value of the reflectance difference ΔR and the reflected hue b* satisfy these ranges, the pattern-observation and the generation of a hue (particularly, a yellowish tone) can be restrained so that the transparent conductive film can be obtained to have a better appearance.

In the present specification, the "reflectance" denotes the luminous reflectance Y of light from a light source D65 of the CIE color coordinate system. The "hue" denotes the L* value, the a* value and the b* value of light from a light source D65 of the L*a*b* color coordinate system prescribed in JIS Z 8729. The "reflected hue" denotes a hue gained from reflected light.

A transparent conductive layer is generally made of a metal oxide, and therefore, the refractive index is high and the reflectance on the surface thereof is high. Accordingly, there is a tendency that a reflectance difference is generated between its pattern-formed parts P and its pattern opening part O so that the pattern is easily sighted. In contrast, in the present invention, the optical adjusting layers are provided between the base material film 1 and the transparent conductive layers 4, respectively, at the front and rear surface sides, whereby interface multiple reflection cancels reflected light rays on the respective surfaces of the transparent conductive layers by interference so that the reflectance of the pattern-formed parts P is decreased. Thus, between the pattern-formed parts P and the pattern opening part O, the reflectance difference is decreased so that the pattern is not easily sighted.

<Double-Sided Transparent Conductive Film Wound Body>

In the present embodiment, the double-sided transparent conductive film 10 may be made into a long body. This long body can be made into a double-sided transparent conductive film wound body in which the long body is wound in a roll form. The wound body of the long double-sided transparent conductive film can be obtained by using, as its base material film, a long-sheet wound body in a roll form, and forming thereon each of the anti-blocking layers, the optical adjusting layers, and the transparent conductive layers as described above in a roll-to-roll manner. In formation of such a wound body, a protective film (separator) including a weakly adhesive layer may be laminated to the surface of the double-sided transparent conductive film, followed by winding the film in a roll shape, but since the double-sided transparent conductive film of this embodiment has improved slidability and blocking resistance, a wound body of a long sheet of double-sided transparent conductive film can be formed without using a protective film. That is, since blocking resistance is imparted, generation of scratches on the film surface at the time of handling is inhibited, and the film is excellent in winding property, so that a wound body is easily obtained by winding a long sheet in a roll shape without laminating a protective film to the surface. Thus, the double-sided transparent conductive film of this embodiment is capable of forming a wound body of a long sheet without using a protective film, and is therefore excellent in workability when used in subsequent formation of a touch panel. Further, the double-sided transparent conductive film contributes to cost reduction and waste reduction by eliminating necessity of a protective film as a process member.

(Touch Panel)

The double-sided transparent conductive film 10 can be suitably applied to, for example, a capacitive touch panel, a resistive touch panel and the like. In particular, even when the transparent conductive layers are patterned, the difference in visibility between the pattern-formed parts and the pattern opening part, in particular, the difference in reflectance therebetween can be restrained into a small level; thus, the film 10 is preferably usable in a touch panel having transparent conductive layers patterned into a predetermined form, such as a projected-capacitive touch panel or a resistive touch panel capable of attaining multi-point input.

For forming a touch panel, another substrate such as glass or a polymer film may be bonded onto any one or both of the main surfaces of the double-sided transparent conductive film through a transparent pressure-sensitive adhesive layer. The transparent substrate may be made of a single substrate film, or a laminate of two or more substrate films (for example, a laminate in which substrate films are laminated onto each other through a transparent pressure-sensitive adhesive layer). A hard coat layer may be provided onto the external surface of the transparent substrate that is bonded onto the double-sided transparent conductive film.

For the pressure-sensitive adhesive layer that is used for laminating the double-sided transparent conductive film and the base material, any material can be used without particular limitation as long as it has transparency. Specifically, for example, one having as a base polymer a polymer such as an acryl-based polymer, a silicone-base polymer, a polyester, a polyurethane, a polyamide, a polyvinyl ether, a vinyl acetate/vinyl chloride copolymer, a modified polyolefin, an epoxy-based polymer, a fluorine-based polymer, or a rubber-based polymer such as natural rubber or synthetic rubber can be appropriately selected and used. Particularly, an acryl-based pressure-sensitive adhesive is preferably used in terms of being excellent in optical transparency, showing adhesive property such as moderate wettability, cohesiveness and tackiness, and also being excellent in weather resistance and heat resistance.

When the above-described double-sided transparent conductive film according to the present invention is used for formation of a touch panel, it is excellent in handling property during formation of the touch panel. Therefore, touch panels excellent in transparency and visibility can be produced with high productivity.

EXAMPLES

The present invention will be described in detail below with Examples, but the present invention is not limited to Examples below as long as the spirit of the present invention is maintained. In examples, "part(s)" refers to "part(s) by weight" unless otherwise specified.

Example 1

Prepared was a coating composition containing a plurality of mono-dispersible particles (manufactured by Soken Chemical Engineering Co., Ltd., trade name "SX-130H") having a mode diameter of 1.3 µm, a binder resin (manufactured by DIC Corporation, trade name "UNIDIC RS29-120"), and ethyl acetate as a solvent. The addition amount of the particles was 0.2 parts based on 100 parts of the binder resin. Next, a gravure coater was used to apply the coating composition onto the both sides of a long base material film (manufactured by Nippon Zeon Co., Ltd., trade name "ZEONOA") having a thickness of 100 µm in such a manner that the applied films would each have a thickness of 1.0 µm after dried. The workpiece was heated at 80° C. for 1 minute to dry the applied films. Thereafter, the workpiece was irradiated with ultraviolet rays giving a cumulative light quantity of 250 mJ/cm$^2$ from a high-pressure mercury lamp to form anti-blocking layers.

Next, a gravure coater was used to apply a refractive index adjustor (JSR Corporation, trade name "OPSTAR Z7412") onto the surface of each of the anti-blocking layers on the both sides. The workpiece was heated at 60° C. for 1 minute to dry the applied films. Thereafter, the workpiece was irradiated with ultraviolet rays giving a cumulative light quantity of 250 mJ/cm$^2$ from a high-pressure mercury lamp to cure the applied films, thus forming, on the both sides, optical adjusting layers each having a thickness of 100 nm (0.1 µm) and a refractive index of 1.62.

Thereafter, the long base material having the anti-blocking layers and the optical adjusting layers was charged into a winding-type sputtering machine, and then indium tin oxide layers each having a thickness of 26 nm were laminated, as transparent conductive layers, onto the surfaces of the both optical adjusting layers (by sputtering using a sintered body composed of 97% by weight of indium oxide and 3% by weight of tin oxide in an atmosphere composed of 98% of argon gas and 2% of oxygen and having a pressure of 0.4 Pa). At this time, the lamination of the optical adjusting layers and the transparent conductive layers was performed along the flat portions and protrusion portions of the anti-blocking layers. In this way, a double-sided transparent conductive film was produced.

The laminated-layer structure of the resultant double-sided transparent conductive film was: transparent conductive layer/optical adjusting layer/anti-blocking layer/base material film/anti-blocking layer/optical adjusting layer/transparent conductive layer. In Table 1 are shown the mode diameter d of the particles, the thickness $T_A$ of each of the anti-blocking layers, the thickness $T_o$ of each of the optical adjusting layers, and the value $(d-T_A)$ obtained by subtracting the thickness $T_A$ of the anti-blocking layer from the mode diameter d of the particles. Methods for measuring the mode diameter and the thicknesses will be described later.

Example 2

A double-sided transparent conductive film was prepared in the same manner as in Example 1 except that monodisperse particles having a mode diameter of 1.5 µm (manufactured by SEKISUI PLASTICS CO., Ltd., trade name "XX-184AA") were used as particles, and the added amount of the particles was 0.3 parts based on 100 parts of the binder resin.

Example 3

A double-sided transparent conductive film was prepared in the same manner as in Example 1 except that monodisperse particles having a mode diameter of 1.9 µm (manufactured by Soken Chemical Engineering Co., Ltd., trade name "MX-180TA") were used as particles, and the added amount of the particles was 0.2 parts based on 100 parts of the binder resin.

Example 4

A double-sided transparent conductive film was prepared in the same manner as in Example 1 except that monodisperse particles having a mode diameter of 2.0 µm (manufactured by SEKISUI PLASTICS CO., Ltd., trade name "XX-134AA") were used as particles, and the added amount of the particles was 0.2 parts based on 100 parts of the binder resin.

Example 5

A double-sided transparent conductive film was prepared in the same manner as in Example 1 except that monodisperse particles having a mode diameter of 2.5 µm (manufactured by NIPPON SHOKUBAI CO., LTD., trade name "KEP-250") were used as particles, and the added amount of the particles was 0.4 parts based on 100 parts of the binder resin.

Example 6

A double-sided transparent conductive film was prepared in the same manner as in Example 1 except that monodisperse particles having a mode diameter of 3.0 µm (manufactured by SEKISUI PLASTICS CO., Ltd., trade name "XX-133AA") were used as particles, and the added amount of the particles was 0.08 parts based on 100 parts of the binder resin.

Example 7

A double-sided transparent conductive film was prepared in the same manner as in Example 1 except that an anti-blocking layer was formed on one side of the base material film, and next onto the other surface was applied a coating composition to which no particles were added, so as to form a hard coat layer instead of the other anti-blocking layer. The laminated-layer structure of the resultant double-sided transparent conductive film was: transparent conductive layer/optical adjusting layer/anti-blocking layer/base material film/hard coat layer (containing no particles)/optical adjusting layer/transparent conductive layer.

Example 8

A double-sided transparent conductive film was prepared in the same manner as in Example 7 except that monodisperse particles having a mode diameter of 1.5 μm (manufactured by SEKISUI PLASTICS CO., Ltd., trade name "XX-184AA") were used as particles for the anti-blocking layer, and the added amount of the particles was 0.3 parts based on 100 parts of the binder resin.

Example 9

A double-sided transparent conductive film was prepared in the same manner as in Example 7 except that monodisperse particles having a mode diameter of 1.9 μm (manufactured by Soken Chemical Engineering Co., Ltd., trade name "MX-180TA") were used as particles for the anti-blocking layer, and the added amount of the particles was 0.2 parts based on 100 parts of the binder resin.

Example 10

A double-sided transparent conductive film was prepared in the same manner as in Example 7 except that monodisperse particles having a mode diameter of 2.0 μm (manufactured by SEKISUI PLASTICS CO., Ltd., trade name "XX-134AA") were used as particles for the anti-blocking layer, and the added amount of the particles was 0.2 parts based on 100 parts of the binder resin.

Example 11

A double-sided transparent conductive film was prepared in the same manner as in Example 7 except that monodisperse particles having a mode diameter of 2.5 μm (manufactured by NIPPON SHOKUBAI CO., LTD., trade name "KEP-250") were used as particles for the anti-blocking layer, and the added amount of the particles was 0.4 parts based on 100 parts of the binder resin.

Example 12

A double-sided transparent conductive film was prepared in the same manner as in Example 7 except that monodisperse particles having a mode diameter of 3.0 μm (manufactured by SEKISUI PLASTICS CO., Ltd., trade name "XX-133AA") were used as particles for the anti-blocking layer, and the added amount of the particles was 0.08 parts based on 100 parts of the binder resin.

Comparative Example 1

A double-sided transparent conductive film was prepared in the same manner as in Example 1 except that monodisperse particles having a mode diameter of 0.8 μm (manufactured by SEKISUI PLASTICS CO., Ltd., trade name "BMSA") were used as particles, and the added amount of the particles was 2 parts based on 100 parts of the binder resin.

Comparative Example 2

A double-sided transparent conductive film was prepared in the same manner as in Example 1 except that in the preparation of the coating composition, no particles were added thereto, and a phase-separation type resin (manufactured by Nippon Paint Co., Ltd., trade name "NAB-010") was used as the binder resin.

Comparative Example 3

A double-sided transparent conductive film was prepared in the same manner as in Example 1 except that in the preparation of the coating composition, no particles were added thereto, and a silica nanoparticle-containing resin (manufactured by Catalysts & Chemicals Industries Co., Ltd., trade name "ELCOM NT-1125HSC") was used as the binder resin (the particles being a mixture of nanoparticles having an average particle diameter of 100 nm and ones having an average particle diameter of 10 nm).

[Evaluation]

Regarding the double-sided transparent conductive film obtained in each of Examples 1 to 12 and Comparative Examples 1 to 3, evaluations described below were made. Respective results of the evaluations are shown in Table 1.

<Refractive Index of Optical Adjusting Layer>

Prepared was a coating liquid for forming the optical adjusting layers. The refractive index of the cured product obtained therefrom was measured according to JIS K 7105. The resultant value was used as the refractive index of the optical adjusting layer. Specifically, a bar coater was used to apply the coating liquid onto an untreated polyethylene terephthalate film (hereinafter referred to as the PET film), and the resultant workpiece was dried at 80° C. for 60 minutes. Next, the resultant workpiece was irradiated with ultraviolet rays having a light quantity of 0.6 J/cm$^2$ to cure the applied film. This operation was repeated two times to form a cured product in which two cured layers were laminated onto each other. Thereafter, the cured product was peeled from the PET film. An Abbe refractometer was used to enter a measuring light ray (sodium D ray) into the resultant cured product and measure the refractive index thereof at 25.0±1.0° C. four times. The average of the measured values was determined to be the refractive index nD25 of the optical adjusting layers.

<Thickness of Each Layer>

For measuring the thicknesses of the anti-blocking layer and the hard coat layer, an instant multi photometry system, "MCPD 2000" (trade name), manufactured by Otsuka Electronics Co., Ltd. was used to measure the waveform of each of respective interference spectra at five points of the film which were located at regular intervals in the width direction of the film. On the basis of the resultant waveforms, the average of the values of the thickness was calculated. The thickness of each of the optical adjusting layer and the transparent conductive film was measured by observing a cross section of the film through a transmission electron microscope (manufactured by Hitachi Ltd., trade mane "HF-7650").

<Mode Diameter of Particles>

A flow-type particle image analyzer (manufactured by Sysmex Corporation, trade name "FPTA-3000S") was used to measure the mode diameter of the particles under predetermined conditions (sheath liquid: ethyl acetate, measurement mode: HPF measurement; and measurement method: total count). A used measuring sample was prepared by diluting the particles with ethyl acetate into 1.0% by weight, and then using an ultrasonic cleaning machine to disperse the particles evenly.

<Anti-Blocking Property>

When the double-sided transparent conductive film was produced in the roll-to-roll manner, it was checked whether or not the films were bonded onto each other in any step of the process. When the bonding was not caused, the film was judged to be "Good"; or when the bonding was caused, the film to "Poor". Moreover, it was checked whether or not the film was scratched in any step of the process. When the scratching was not caused, the film was judged to be "Good"; or when the scratching was caused, the film to "Poor".

<Haze>

A haze meter (manufactured by Murakami Color Research Laboratory Co., Ltd., model number "HM-150") was used to measure the haze of the produced double-sided transparent conductive film in accordance with the haze (turbidity) in JIS K 7136 (2000).

further the thickness of the optical adjusting layer was adjusted to a value shown in Table 2. In each of Examples 26 and 27, a double-sided transparent conductive film was prepared in the same manner as in Example 1 except that one of refractive index adjustors shown in Table 4 (each manufactured by JSR Corporation; in this table, trade names thereof are shown) was used to form two optical adjusting layers (a first optical adjusting layer at the base material film side, and a second optical adjusting layer at the ITO film side) onto each of the both sides of the film, and further the thickness of the optical adjusting layer was adjusted to a value shown in Table 4.

Next, the transparent conductive layer only at one side of the base material film was patterned to form a double-sided transparent conductive film having a double-sided patterned region where the transparent conductive layers were formed on the respective both sides of the base material film, and a single-side patterned region where the transparent conductive layer was formed only on one side of the base material film. Specifically, from the produced double-sided transparent conductive film, a sample 100 mm×100 mm in size was cut out, and a cellophane tape was bonded to a half (50 mm×100 mm in size) of the outer surface of the transparent

TABLE 1

| | Anti-blocking layer structure | Mode diameter d of particle [μm] | Flat portion thickness $T_A$ of anti-blocking layer [μm] | d − $T_A$ [μm] | Thickness $T_o$ of optical adjusting layer [μm] | Film bonding | Film scratching | Haze [%] |
|---|---|---|---|---|---|---|---|---|
| Example 1 | Both sides | 1.3 | 1 | 0.3 | 0.1 | Good | Good | 2 |
| Example 2 | | 1.5 | 1 | 0.5 | 0.1 | Good | Good | 2.2 |
| Example 3 | | 1.9 | 1 | 0.9 | 0.1 | Good | Good | 2.4 |
| Example 4 | | 2 | 1 | 1 | 0.1 | Good | Good | 1.3 |
| Example 5 | | 2.5 | 1 | 1.5 | 0.1 | Good | Good | 2.2 |
| Example 6 | | 3 | 1 | 2 | 0.1 | Good | Good | 1.2 |
| Example 7 | One side | 1.3 | 1 | 0.3 | 0.1 | Good | Good | 1 |
| Example 8 | | 1.5 | 1 | 0.5 | 0.1 | Good | Good | 1.1 |
| Example 9 | | 1.9 | 1 | 0.9 | 0.1 | Good | Good | 1.2 |
| Example 10 | | 2 | 1 | 1 | 0.1 | Good | Good | 0.7 |
| Example 11 | | 2.5 | 1 | 1.5 | 0.1 | Good | Good | 1.1 |
| Example 12 | | 3 | 1 | 2 | 0.1 | Good | Good | 0.7 |
| Comparative Example 1 | Both sides | 0.8 | 1 | (−0.2) | 0.1 | Poor | Poor | 1.6 |
| Comparative Example 2 | Phase-separation type | — | 1.3 | — | 0.1 | Poor | Poor | 0.8 |
| Comparative Example 3 | Nanoparticle contained | — | 2 | — | 0.1 | Poor | Poor | 0.3 |

In the double-sided transparent conductive films obtained in Examples described above, the anti-blocking property was good and the values of the haze were each 3% or less to show excellent transparency. However, in the double-sided transparent conductive films obtained in Comparative Examples, the bonding or the scratching of the films in the producing process was caused to show poor anti-blocking property although the haze was low. It can be considered that this was caused by a matter that the protrusion portions resulting from the particles were lost by the formation of the optical adjusting layers, or sufficient protrusion portions were not formed.

Examples 13 to 27

In each of Examples 13 to 25, a double-sided transparent conductive film was prepared in the same manner as in Example 1 except that one of refractive index adjustors shown in Table 2 (each manufactured by JSR Corporation; in this table, trade names thereof are shown) was used to change the refractive index of the optical adjusting layer, and conductive layer at one side of the base material film so that one half surface was a pattern-formed part and the other half surface was a pattern opening part. Furthermore, a cellophane tape was bonded to the whole of the outer surface of the transparent conductive layer at the other side. Thereafter, this workpiece was immersed in a 10% by weight hydrochloric acid (solution of hydrogen chloride in water) at 50° C. for 10 minutes to etch one of the transparent conductive layers. Thereafter, the cellophane tapes at the both sides were removed, and the workpiece was heated at 140° C. for 90 minutes to crystallize the transparent conductive layers, thus producing a double-sided transparent conductive film in which only the transparent conductive layer at one side was patterned.

[Evaluation]

Regarding the double-sided transparent conductive film obtained in each of Examples 13 to 27, evaluations described below were made. Respective results of the evaluations are shown in Tables 2 to 5.

<Evaluations of Pattern Appearance (Reflectance Difference ΔR (Y Value) and Reflected Hue b*>

Regarding the double-sided transparent conductive film in which only the transparent conductive layer at one side was patterned and the transparent conductive layers were crystallized, a spectroscope "U-4100" (trade name) manufactured by Hitachi High-Technologies Corporation was used in an integrating sphere mode to measure the spectral reflectance (specular reflectance+diffuse reflectance) thereof. The total reflectance (Y value) and the reflected hue b* thereof in a 2° viewing field through the use of a D65 light ray source were obtained by calculation. The measurement was made in the state of bonding a black acrylic plate onto the surface of the unpatterned transparent conductive layer to form a light-shielding layer so that reflection on the rearmost surface of the sample, and the incidence of light from the rear side thereof were hardly generated. The results of the evaluation are shown in Tables 2 and 4. Furthermore, in the same way as described above, a light-shielding layer was formed onto the unpatterned transparent conductive layer side, and then an pressure-sensitive adhesive (manufactured by Nitto Denko Corporation, trade name "LUCI-ACS (registered trade name) CS96217") was used to bond a transparent film (manufactured by Nippon Zeon Co., Ltd., trade name "ZEONOA") having a thickness of 100 μm onto the patterned transparent conductive layer to cover its pattern-formed part and the pattern opening part. In this state, the same measurement was made. The results of the evaluation are shown in Tables 3 and 5.

TABLE 2

|  | Pattern state | Refractive index adjustor | Refractive index of optical adjusting layer | Thickness of optical adjusting layer [nm] | Refractive index of transparent conductive layer | Thickness of transparent conductive layer [nm] | Reflectance difference ΔR (Y) [%] | Reflected hue b* |
|---|---|---|---|---|---|---|---|---|
| Example 13 | Pattern exposed | KZ661 | 1.655 | 115 | 1.9 | 26 | 0.55 | 3.1 |
| Example 14 |  | KZ661 | 1.655 | 125 | 1.9 | 26 | 0.6 | 2.45 |
| Example 15 |  | KZ661 | 1.655 | 135 | 1.9 | 26 | 1.01 | 1.01 |
| Example 16 |  | Z7412 | 1.62 | 80 | 1.9 | 26 | 2.26 | −3.78 |
| Example 17 |  | Z7412 | 1.62 | 100 | 1.9 | 26 | 0.74 | −2.52 |
| Example 18 |  | Z7412 | 1.62 | 115 | 1.9 | 26 | 0.53 | −3.68 |
| Example 19 |  | Z7412 | 1.62 | 125 | 1.9 | 26 | 0.6 | −4.49 |
| Example 20 |  | Z7412 | 1.62 | 130 | 1.9 | 26 | 0.65 | −5.62 |
| Example 21 |  | Z7412 | 1.62 | 135 | 1.9 | 26 | 0.73 | −9.52 |
| Example 22 |  | Z7412 | 1.62 | 140 | 1.9 | 26 | 0.67 | −9.97 |
| Example 23 |  | KZ6720 | 1.6 | 75 | 1.9 | 26 | 2.93 | −5.81 |
| Example 24 |  | KZ6720 | 1.6 | 100 | 1.9 | 26 | 2.67 | −5.08 |
| Example 25 |  | KZ6720 | 1.6 | 120 | 1.9 | 26 | 1.87 | −4.26 |

TABLE 3

|  | Pattern state | Refractive index adjustor | Refractive index of optical adjusting layer | Thickness of optical adjusting layer [nm] | Refractive index of transparent conductive layer | Thickness of transparent conductive layer [nm] | Reflectance difference ΔR (Y) [%] | Reflected hue b* |
|---|---|---|---|---|---|---|---|---|
| Example 13 | Pattern covered | KZ661 | 1.655 | 115 | 1.9 | 26 | 0.14 | 1.44 |
| Example 14 |  | KZ661 | 1.655 | 125 | 1.9 | 26 | 0.32 | 0.4 |
| Example 15 |  | KZ661 | 1.655 | 135 | 1.9 | 26 | 0.44 | −1.23 |
| Example 16 |  | Z7412 | 1.62 | 80 | 1.9 | 26 | 0.8 | −2.55 |
| Example 17 |  | Z7412 | 1.62 | 100 | 1.9 | 26 | 0.54 | −1.86 |
| Example 18 |  | Z7412 | 1.62 | 115 | 1.9 | 26 | 0.21 | −3.74 |
| Example 19 |  | Z7412 | 1.62 | 125 | 1.9 | 26 | 0.23 | −4.45 |
| Example 20 |  | Z7412 | 1.62 | 130 | 1.9 | 26 | 0.24 | −5.53 |
| Example 21 |  | Z7412 | 1.62 | 135 | 1.9 | 26 | 0.23 | −8.58 |
| Example 22 |  | Z7412 | 1.62 | 140 | 1.9 | 26 | 0.24 | −9.93 |
| Example 23 |  | KZ6720 | 1.6 | 75 | 1.9 | 26 | 1.1 | −4.63 |
| Example 24 |  | KZ6720 | 1.6 | 100 | 1.9 | 26 | 0.96 | −4.31 |
| Example 25 |  | KZ6720 | 1.6 | 120 | 1.9 | 26 | 0.7 | −3.72 |

TABLE 4

|  | Pattern state | Refractive index adjustor | First optical adjusting layer (at base material side) | | Second optical adjusting layer (at ITO film side) | | Total thickness of optical adjusting layer [nm] | Refractive index of transparent conductive layer | Thickness of transparent conductive layer [nm] | Reflectance difference ΔR (Y) [%] | Reflected hue b* |
|---|---|---|---|---|---|---|---|---|---|---|---|
|  |  |  | Refractive index of optical adjusting layer | Thickness of optical adjusting layer [nm] | Refractive index adjustor | Refractive index of optical adjusting layer | Thickness of optical adjusting layer [nm] |  |  |  |  |  |
| Example 26 | Pattern exposed | KZ6753 | 1.7 | 40 | KZ6498 | 1.5 | 40 | 80 | 1.9 | 26 | 0.42 | −0.10 |

TABLE 4-continued

| | Pattern state | First optical adjusting layer (at base material side) | | | Second optical adjusting layer (at ITO film side) | | | Total thickness of optical adjusting layer [nm] | Refractive index of transparent conductive layer | Thickness of transparent conductive layer [nm] | Reflectance difference ΔR (Y) [%] | Reflected hue b* |
| | | Refractive index adjustor | Refractive index of optical adjusting layer | Thickness of optical adjusting layer [nm] | Refractive index adjustor | Refractive index of optical adjusting layer | Thickness of optical adjusting layer [nm] | | | | | |
|---|---|---|---|---|---|---|---|---|---|---|---|---|
| Example 27 | | KZ6753 | 1.7 | 40 | KZ6492 | 1.49 | 40 | 80 | 1.9 | 26 | 0.73 | −0.96 |

TABLE 5

| | Pattern state | First optical adjusting layer (at base material side) | | | Second optical adjusting layer (at ITO film side) | | | Total thickness of optical adjusting layer [nm] | Refractive index of transparent conductive layer | Thickness of transparent conductive layer [nm] | Reflectance difference ΔR (Y) [%] | Reflected hue b* |
| | | Refractive index adjustor | Refractive index of optical adjusting layer | Thickness of optical adjusting layer [nm] | Refractive index adjustor | Refractive index of optical adjusting layer | Thickness of optical adjusting layer [nm] | | | | | |
|---|---|---|---|---|---|---|---|---|---|---|---|---|
| Example 26 | Pattern covered | KZ6753 | 1.7 | 40 | KZ6498 | 1.5 | 40 | 80 | 1.9 | 26 | 0.28 | −4.15 |
| Example 27 | | KZ6753 | 1.7 | 40 | KZ6492 | 1.49 | 40 | 80 | 1.9 | 26 | 0.32 | −4.11 |

According to the results in Table 2, in the state where the patterned transparent conductive layer was exposed, good results for the reflectance difference ΔR (Y value) and the reflected hue b* were obtained in Examples 17 to 22, in which the respective refractive indexes of their optical adjusting layers were 1.62 and the respective thicknesses thereof were 100 nm, 115 nm, 125 nm, 130 nm, 135 nm, and 140 nm. According to the results in Table 3, in the state where the patterned transparent conductive layer was covered with the pressure-sensitive adhesive and the transparent film, good results for the reflectance difference ΔR (Y value) and the reflected hue b* were obtained in Example 15, in which the refractive index of its optical adjusting layers was 1.655 and the thickness thereof was 135 nm; Examples 16 to 22, in which the respective refractive indexes of their optical adjusting layers were 1.62 and the respective thicknesses thereof were 80 nm, 100 nm, 115 nm, 125 nm, 130 nm, 135 nm, and 140 nm; and Examples 24 and 25, in which the respective refractive indexes of their optical adjusting layers were 1.6 and the respective thicknesses thereof were 100 nm, and 120 nm. From these results, it is understood that when the refractive indexes of the optical adjusting layers are from 1.61 to 1.65, the thickness of each of the optical adjusting layers is preferably from about 90 to 150 nm from the viewpoint of the restraint of pattern visibility and the restraint of the generation of a hue. According to the results in Tables 4 and 5, in the state where the two optical adjusting layers were formed on each of the both sides in Examples 26 and 27, both the reflectance difference ΔR (Y value) and the reflected hue b* were good. Examples 26 and 27 were compared with Example 16 or 23, which was equivalent in (total) thickness to Examples 26 and 27. Examples 26 and 27, which each had the two layers structure of the optical adjusting layers, were better particularly in reflectance difference than Example 16 or 23 in any cases that the pattern state was exposed or covered. Furthermore, the state where the patterned transparent conductive layer was covered with the pressure-sensitive adhesive and the transparent film is compared with the state where the patterned transparent conductive layer was exposed. In the former, the irregularities of the pattern-formed part and the pattern opening part of one of the outermost surface layers were buried so that the reflectance difference between the two parts was also restrained to produce better results among the various structures.

What is claimed is:

1. A double-sided transparent conductive film, comprising a base material film, and
   an optical adjusting layer and a transparent conductive layer which are formed in this order on each of both sides of the base material film,
   wherein an anti-blocking layer containing particles is formed at least one of:
   a location between the base material film and one optical adjusting layer; and
   a location between the base material film and the other optical adjusting layer,
   the anti-blocking layer has a flat portion and protrusion portions caused by the particles, and
   a value obtained by subtracting a thickness of the flat portion of the anti-blocking layer from a mode diameter of the particles is larger than a thickness of the optical adjusting layer.

2. The double-sided transparent conductive film according to claim 1, wherein the optical adjusting layers each have a thickness of 50 to 300 nm.

3. The double-sided transparent conductive film according to claim 1, wherein the optical adjusting layers are each a layer formed by wet coating.

4. The double-sided transparent conductive film according to claim 1, wherein a value obtained by subtracting the thickness of the flat portion of the anti-blocking layer from a height of the protrusion portion of the anti-blocking layer is larger than the thickness of the optical adjusting layer.

5. The double-sided transparent conductive film according to claim 1, which has a haze of 5% or less.

6. The double-sided transparent conductive film according to claim 1, wherein each of the transparent conductive layers is patterned and has a pattern-formed part where the transparent conductive layer forms a pattern, and a pattern opening part where the transparent conductive layer is removed.

7. The double-sided transparent conductive film according to claim 6, wherein an absolute value of a difference in reflectance between the following regions when seeing through in planar view is 1% or less:
 a double-sided patterned region where the pattern-formed parts on both sides overlap with each other; and
 a single-side patterned region having the pattern-formed part on one surface and the pattern opening part on the other surface.

8. The double-sided transparent conductive film according to claim 7, wherein the double-sided patterned region has a reflected hue b* satisfying the following: $-10 \leq b^* \leq 0$.

9. The double-sided transparent conductive film according to claim 1, wherein the base material film comprises a cycloolefin-based resin.

10. A double-sided transparent conductive film wound body, comprising a long body of the double-sided transparent conductive film according to claim 1 wound in a roll form.

11. A touch panel, comprising a double-sided transparent conductive film according to claim 1.

* * * * *